(12) United States Patent
Zeng et al.

(10) Patent No.: US 9,887,242 B2
(45) Date of Patent: Feb. 6, 2018

(54) COMPLEMENTARY METAL OXIDE SEMICONDUCTOR ELEMENT AND MANUFACTURE METHOD THEREOF

(71) Applicant: Shenzhen China Star Optoelectronics Technology Co., Ltd., Shenzhen, Guangdong (CN)

(72) Inventors: Mian Zeng, Guangdong (CN); Xiangzhi Xiao, Guangdong (CN); Shengdong Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 116 days.

(21) Appl. No.: 14/917,004

(22) PCT Filed: Jan. 1, 2016

(86) PCT No.: PCT/CN2016/070916
§ 371 (c)(1),
(2) Date: Mar. 5, 2016

(87) PCT Pub. No.: WO2017/107268
PCT Pub. Date: Jun. 29, 2017

(65) Prior Publication Data
US 2017/0301734 A1    Oct. 19, 2017

(30) Foreign Application Priority Data
Dec. 22, 2015   (CN) .......................... 2015 1 0970419

(51) Int. Cl.
*H01L 27/28* (2006.01)
*H01L 29/786* (2006.01)
*H01L 21/8238* (2006.01)

(52) U.S. Cl.
CPC .......... *H01L 27/286* (2013.01); *H01L 27/283* (2013.01); *H01L 21/8238* (2013.01); *H01L 27/288* (2013.01); *H01L 29/7869* (2013.01)

(58) Field of Classification Search
CPC ..... H01L 27/28; H01L 27/288; H01L 27/286; H01L 27/283; H01L 27/11807;
(Continued)

(56) References Cited

U.S. PATENT DOCUMENTS

2009/0224245 A1* 9/2009 Umezaki .............. G09G 3/3677
257/59
2011/0303918 A1* 12/2011 Im ...................... H01L 27/1225
257/59

(Continued)

*Primary Examiner* — Thanh T Nguyen
(74) *Attorney, Agent, or Firm* — Andrew C. Cheng

(57) ABSTRACT

Disclosed is a CMOS element. The CMOS element comprises a substrate, a first metal layer, an insulation layer and a first type metal oxide semiconductor layer; and the element further comprises a first, a second and a third metal parts which are located on the insulation layer, and the first and the second metal parts are located at two sides of the first type metal oxide semiconductor layer and both contacts therewith; a second type organic semiconductor layer, located in a gap between the second, and the third metal parts and on the second, the third metal parts where are adjacent to the gap; a passivation layer, located on the first, the second and the third metal parts, the first type metal oxide semiconductor layer and the second type organic semiconductor layer; a third metal layer located on the passivation layer corresponding to the second type organic semiconductor layer.

5 Claims, 5 Drawing Sheets

1

(58) Field of Classification Search
CPC ........... H01L 27/0922; H01L 27/14643; H01L 21/82; H01L 21/82285; H01L 21/8238; H01L 29/7869; H01L 27/0286
See application file for complete search history.

(56) References Cited

U.S. PATENT DOCUMENTS

| | | | |
|---|---|---|---|
| 2014/0225075 A1* | 8/2014 | Zhan | H01L 29/78672 257/40 |
| 2014/0322849 A1* | 10/2014 | Kim | H01L 51/0008 438/34 |
| 2015/0031155 A1* | 1/2015 | Shim | H01L 51/56 438/34 |
| 2016/0141547 A1* | 5/2016 | Kim | H01L 51/5246 257/40 |
| 2016/0239143 A1* | 8/2016 | Song | G06F 3/0416 |

* cited by examiner

COMPLEMENTARY METAL OXIDE SEMICONDUCTOR ELEMENT AND MANUFACTURE METHOD THEREOF

CROSS REFERENCE

This application claims the priority of Chinese Patent Application No. 201510970419.4, entitled "Complementary metal oxide semiconductor element and manufacture method thereof", filed on Dec. 22, 2015, the disclosure of which is incorporated herein by reference in its entirety.

FIELD OF THE INVENTION

The present invention relates to a semiconductor field, and more particularly, relates to a complementary metal oxide semiconductor element and a manufacture method thereof.

BACKGROUND OF THE INVENTION

The Complementary Metal Oxide Semiconductor (COMS) element is constructed with the P-channel Metal Oxide Semiconductor (PMOS) and the N-channel Metal Oxide Semiconductor (NMOS), together. The CMOS element is the most fundamental circuit structure of the driving chip in the liquid crystal display. In traditional LCD, the driving chip and the substrate (such as the glass substrate) are separately designed without integration, which makes the manufacture cost of the LCD is higher and the thin and light design is hard to be real. In case that the driving chip can be directly manufactured on the substrate, it will be a huge progress for the display devices, such as LCDs. At present, the Low Temperature Poly-silicon (LTPS) technology is generally employed to manufacture the CMOS element on the substrate, which has certain progress in comparison with the separate design of the driving chip and the substrate. However, the LTPS technology is to respectively manufacture the semiconductor layers of the PMOS and the NMOS in the CMOS element. The relatively complicated manufacturing processes such as the laser annealing, doping, and ion implantation are included, and thus the cost is higher.

SUMMARY OF THE INVENTION

The present invention provides a complementary metal oxide semiconductor element, wherein the complementary metal oxide semiconductor element comprises:

a substrate, and the substrate comprises a first surface and a second surface, which are oppositely located;

a first metal layer located in the middle of the first surface;

an insulation layer located at the first metal layer and the first surface which does not cover the first metal layer;

a first type metal oxide semiconductor layer located on the insulation layer corresponding to the first metal layer;

a first metal part, a second metal part and a third metal part separately located on the insulation layer, respectively, and the first metal part and the second metal part are separately located at two sides of the first type metal oxide semiconductor layer and both contacts with the first type metal oxide semiconductor layer, and the second metal part is located between the first metal part and a third metal part, wherein the first metal part, the second metal part and the third metal part are defined to be a second metal layer;

a second type organic semiconductor layer, and the second type organic semiconductor layer is located in a gap between the second metal part and the third metal part, and on the second metal part and the third metal part where are adjacent to the gap;

a passivation layer, located on the first metal part, the second metal part and the third metal part, the first type metal oxide semiconductor layer between the first metal part and the second metal part, and the second type organic semiconductor layer;

a third metal layer, located on the passivation layer corresponding to the second type organic semiconductor layer.

The complementary metal oxide semiconductor element further comprises:

a first etching stopper layer, and the first etching stopper layer comprises a first via, and the first etching stopper layer is located between the first metal part and the first type metal oxide semiconductor layer, and the first metal part is connected with the first type metal oxide semiconductor layer through the first via.

The complementary metal oxide semiconductor element further comprises:

a second etching stopper layer, and the second etching stopper layer comprises a second via, and the second etching stopper layer is located between the second metal part and the first type metal oxide semiconductor layer, and the second metal part is connected with the first type metal oxide semiconductor layer through the second via.

The first type metal oxide semiconductor layer is an N-type metal oxide semiconductor layer, and the second type organic semiconductor layer is a P-type organic semiconductor layer; or the first type metal oxide semiconductor layer is a P-type metal oxide semiconductor layer, and the second type organic semiconductor layer is an N-type organic semiconductor layer.

As the first type metal oxide semiconductor layer is the N-type metal oxide semiconductor layer, the first type metal oxide semiconductor layer is IGZO or ITZO.

The present invention further provides a manufacture method of a complementary metal oxide semiconductor element, wherein the manufacture method of the complementary metal oxide semiconductor element comprises:

providing a substrate, and the substrate comprises a first surface and a second surface, which are oppositely located;

forming a first metal layer located in the middle of the first surface;

forming an insulation layer located at the first metal layer which does not cover the first surface of the first metal layer;

forming a first type metal oxide semiconductor layer located on the insulation layer corresponding to the first metal layer;

forming a first metal part, a second metal part and a third metal part separately located on the insulation layer, and the first metal part and the second metal part are separately located at two sides of the first type metal oxide semiconductor layer and both contacts with the first type metal oxide semiconductor layer, and the second metal part is located between the first metal part and a third metal part, wherein the first metal part, the second metal part and the third metal part are defined to be a second metal layer;

forming a second type organic semiconductor layer corresponding to a gap between the second metal part and the third metal part, and where are on the second metal part and the third metal part and adjacent to the gap;

forming a passivation layer on the second type organic semiconductor layer;

forming a third metal layer, located on the passivation layer corresponding to the second type organic semiconductor layer.

The manufacture method of the complementary metal oxide semiconductor element further comprises:

forming a first etching stopper layer, and a first via is formed in the first etching stopper layer, and the first etching stopper layer is located between the first metal part and the first type metal oxide semiconductor layer, and the first metal part is connected with the first type metal oxide semiconductor layer through the first via;

forming a second etching stopper layer, and a second via is formed in the second etching stopper layer, and the second etching stopper layer is located between the second metal part and the first type metal oxide semiconductor layer, and the second metal part is connected with the first type metal oxide semiconductor layer through the second via.

The step of forming a first metal layer located in the middle of the first surface comprises:

forming a first conductive layer, of which material of an entire layer is metal on the first surface;

covering the first conductive layer with a first photoresist layer;

exposing the first photoresist layer to remove the first photoresist layer at two sides of the first conductive layer;

etching the first conductive layer which is not covered with the first photoresist layer to remove the first conductive layer which is not covered with the first photoresist layer;

stripping the first photoresist layer which is remained to form the first metal layer.

The step of forming a first type metal oxide semiconductor layer located on the insulation layer corresponding to the first metal layer comprises:

forming a first semiconductor layer which is an entire layer on the insulation layer;

covering the entire first semiconductor layer with a second photoresist layer;

exposing the second photoresist layer to remove the second photoresist layer at two sides of the first semiconductor layer to preserve the second photoresist layer corresponding to the first metal layer;

etching the first semiconductor layer which is not covered with the second photoresist layer to remove the first semiconductor layer which is not covered with the second photoresist layer;

stripping the second photoresist layer which is remained to form the first type metal oxide semiconductor layer.

The step of forming a first metal part, a second metal part and a third metal part separately located on the insulation layer, and the first metal part and the second metal part are separately located at two sides of the first type metal oxide semiconductor layer and both contacts with the first type metal oxide semiconductor layer, and the second metal part is located between the first metal part and a third metal part, wherein the first metal part, the second metal part and the third metal part are defined to be a second metal layer comprises:

forming a second conductive layer, of which material of an entire layer is metal on the insulation layer;

covering the second conductive layer with a third photoresist layer;

exposing the third photoresist layer to form a first via corresponding to a middle of the first type metal oxide semiconductor layer and a second via separately located with the first via to partially expose the second conductive layer;

etching the second conductive layer which is not covered with the third photoresist layer to remove the second conductive layer which is not covered with the third photoresist layer;

stripping the third photoresist layer to form the first metal part, the second metal part and the third metal part.

In comparison with prior art, the NMOS and the PMOS in the CMOS element of the present invention and the manufacture method of the CMOS element are manufactured with the first type metal oxide semiconductor layer and the second type organic semiconductor layer. Therefore, the processes of the laser annealing, doping, and ion implantation required in prior art utilizing the LTPS process, and the high cost manufacture equipments required for these processes can be omitted. Accordingly, the manufacture process of the CMOS can be simplified to reduce the production cost of the CMOS element. Besides, the drain of the NMOS and the source of the PMOS are connected, the solo step of connecting the drain of the NMOS and the source of the PMOS is no longer required, and the manufacture process of the CMOS element can be simplified in advance.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
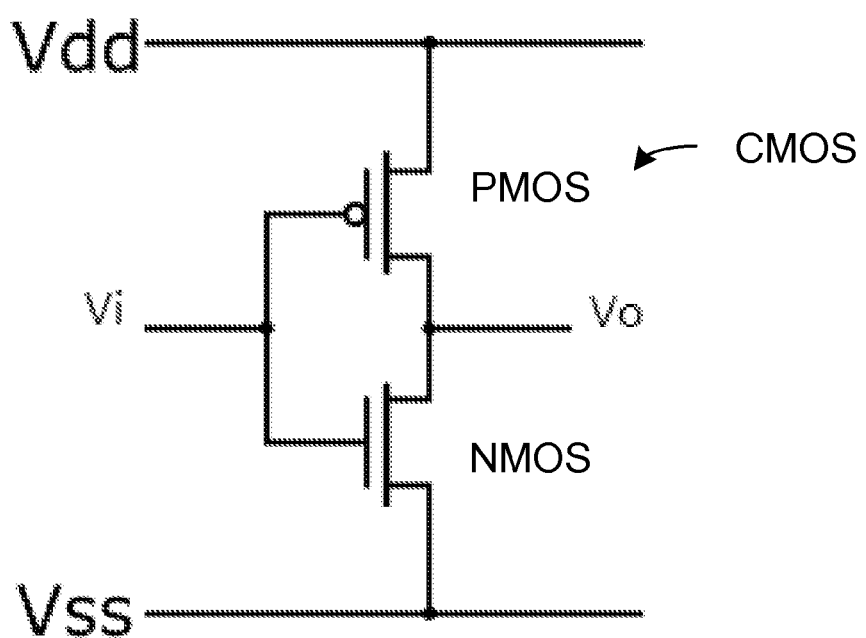
FIG. 1 is a circuit structure diagram of a complementary metal oxide semiconductor element according to a preferred embodiment of the present invention.
Figure 2:
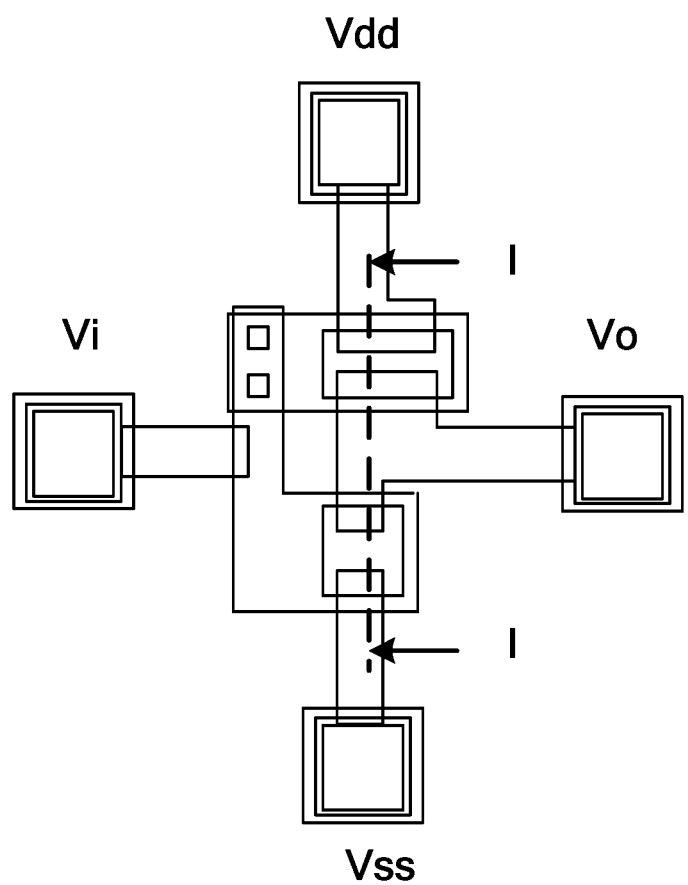
FIG. 2 is a circuit board diagram of the complementary metal oxide semiconductor element in FIG. 1.
Figure 3:
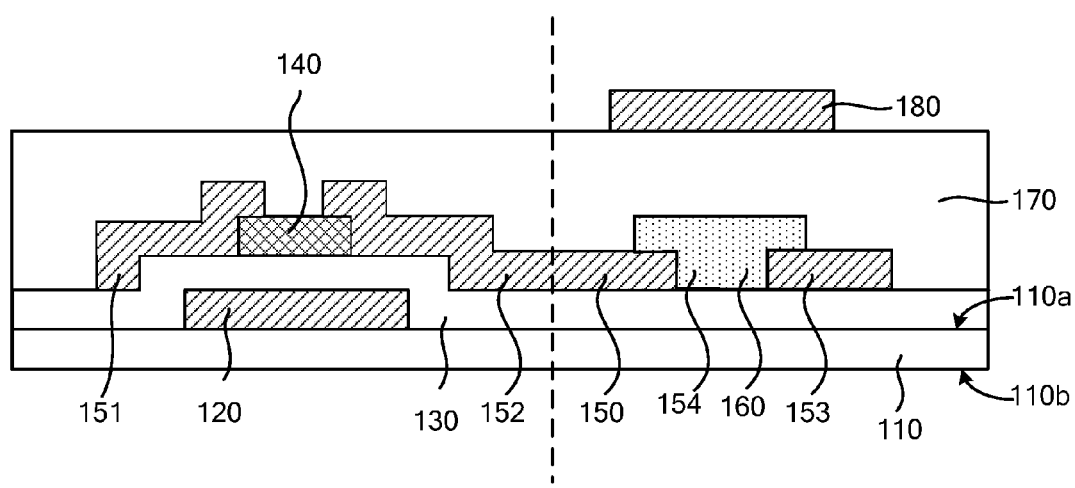
FIG. 3 is a sectional structure diagram of one preferred embodiment along the I-I line in FIG. 2.

Please refer to FIG. 1, FIG. 2 and FIG. 3, together. FIG. 1 is a circuit structure diagram of a complementary metal oxide semiconductor element according to a preferred embodiment of the present invention; FIG. 2 is a circuit board diagram of the complementary metal oxide semiconductor element in FIG. 1; FIG. 3 is a sectional structure diagram of one preferred embodiment along the I-I line in FIG. 2. The Complementary Metal Oxide Semiconductor (COMS) element 1 comprises a substrate 110, and the substrate 110 comprises a first surface 110a and a second surface 110b, which are oppositely located; a first metal layer 120 located in the middle of the first surface 110a; an insulation layer 130 located at the first metal layer 120 which does not cover the first surface 110a of the first metal layer 120; a first type metal oxide semiconductor layer 140 located on the insulation layer 130 corresponding to the first metal layer 120; a first metal part 151, a second metal part 152 and a third metal part 153 separately located on the insulation layer 130, respectively, and the first metal part 151 and the second metal part 152 are separately located at two sides of the first type metal oxide semiconductor layer 140 and both contacts with the first type metal oxide semiconductor layer 140, and the second metal part 152 is located between the first metal part 151 and the third metal part 153, wherein the first metal part 151, the second metal part 152 and the third metal part 153 are defined to be a second metal layer 150; a second type organic semiconductor layer 160, and the second type organic semiconductor layer 160 is located in a gap 154 between the second metal part 152 and the third metal part 153, and on the second metal part 152 and the third metal part 153 where are adjacent to the gap 154; a passivation layer 170, located on the first metal part 151, the second metal part 152 and the third metal part 153, the first type metal oxide semiconductor layer 140 between the first metal part 151 and the second metal part 152, and the second type organic semiconductor layer 160; a third metal layer 180, located on the passivation layer 170 corresponding to the second type organic semiconductor layer 160.

In this embodiment, the first type metal oxide semiconductor layer 140 is a N-type metal oxide semiconductor layer, and the second type organic semiconductor layer 160 is a P-type organic semiconductor layer. It should be understood that in another embodiment, the first type metal oxide semiconductor layer 140 is a P-type metal oxide semiconductor layer, and the second type organic semiconductor layer 160 is a N-type organic semiconductor layer. As the first type metal oxide semiconductor layer 140 is the N-type metal oxide semiconductor layer, the first type metal oxide semiconductor layer 140 is Indium Gallium Zinc Oxide (IGZO) or Indium Tin Zinc Oxide (ITZO).

The introduction is conducted that the first type metal oxide semiconductor layer 140 is a N-type metal oxide semiconductor layer, and the second type organic semiconductor layer 160 is a P-type organic semiconductor layer. Then, which comprises the first type metal oxide semiconductor layer 140 is a N-channel Metal Oxide Semiconductor (NMOS), and which comprises the second type organic semiconductor layer 160 is a P-channel Metal Oxide Semiconductor (PMOS). Namely, in FIG. 3, the NMOS is at the left side of the dot line, and the PMOS is at the right side of the dot line. The first metal layer 120 is the gate of the NMOS, and the insulation layer 130 on the first metal layer 120 is the gate isolation layer of the NMOS, and the first metal part 151 is the source of the NMOS, and the second metal part 152 at the left side of the dot line is the drain of the NMOS. The insulation layer 130 at the right side of the dot line constructs the buffer layer of the PMOS. Then, the gate isolation layer of the NMSO and the buffer layer of the PMOS share the same layer, and the second metal part 152 at the right side of the dot line is the source of the PMOS. Because the second metal part 152 is an unitary body, the drain of the NMOS and the source of the PMOS are shared. The third metal part 153 construct the drain of the PMOS, and the second type organic semiconductor layer 160 is the channel layer of the PMOS, and the passivation layer 170 located on the second type organic semiconductor layer 160 construct the gate isolation layer of the PMOS. Then, the passivation layer of the NMOS and the gate isolation layer of PMOS share the same layer. The third metal layer 180 constructs the gate of the PMOS.

In this embodiment, that the respective layer structures are directly or indirectly located on the first surface 100a is illustrated for description. It is understood that in other embodiments, the respective layer structures also can be directly or indirectly located on the second surface 100b.

Figure 4:
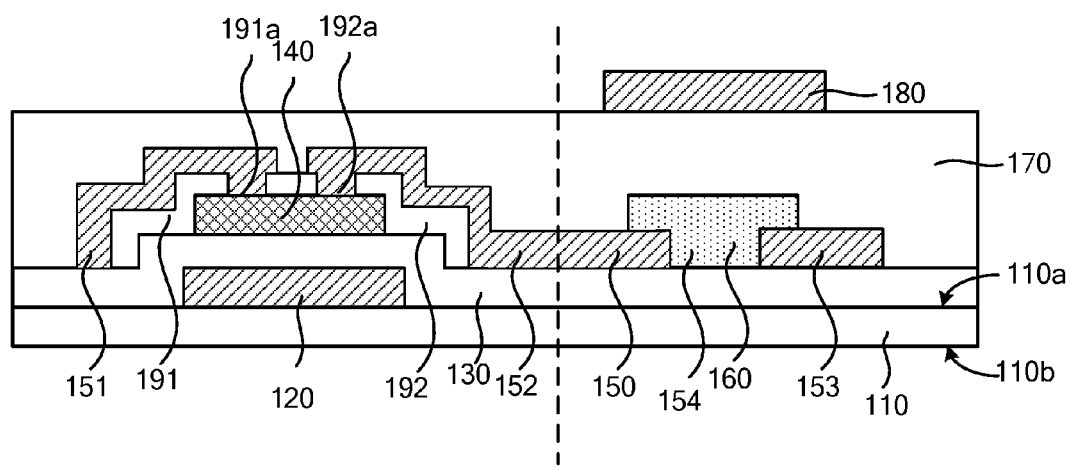
FIG. 4 is a sectional structure diagram of another preferred embodiment along the I-I line in FIG. 3.

Please refer to FIG. 4. FIG. 4 is a sectional structure diagram of another preferred embodiment along the I-I line in FIG. 3. In this embodiment, the CMOS element 1 further comprises a first etching stopper layer 191, and the first etching stopper layer 191 comprises a first via 191a, and the first etching stopper layer 191 is located between the first metal part 151 and the first type metal oxide semiconductor layer 140, and the first metal part 151 is connected with the first type metal oxide semiconductor layer 140 through the first via 191a. The CMOS element further comprises a second etching stopper layer 192, and the second etching stopper layer 192 comprises a second via 192a, and the second etching stopper layer 192 is located between the second metal part 152 and the first type metal oxide semiconductor layer 140, and the second metal part 152 is connected with the first type metal oxide semiconductor layer 140 through the second via 192a. Both the first etching stopper layer 191 and the second etching stopper layer 192 are employed to protect the first type metal oxide semiconductor layer 140 so that the influence of the dry etching process to the first type metal oxide semiconductor layer 140 in the procedure of forming the second type organic semiconductor layer 160 can be prevented.

It is understood that in one embodiment, the CMOS element 1 only comprises the first etching stopper layer 191 without the second etching stopper layer 192; or in another embodiment, the CMOS element 1 only comprises the second etching stopper layer 192 without the first etching stopper layer 191. As the CMOS element 1 comprises one etching stopper layer (the first etching stopper layer 191 or the second etching stopper layer 192), it still can protect the first type metal oxide semiconductor layer 140 in comparison with the CMOS element without the etching stopper layer so that the influence of the dry etching process to the first type metal oxide semiconductor layer 140 in the procedure of forming the second type organic semiconductor layer 160 can be prevented; as the CMOS element 1 comprises the first etching stopper layer 191 and the second etching stopper layer 192 at the same time, it can better protect the first type metal oxide semiconductor layer 140 so that the influence of the dry etching process to the first type metal oxide semiconductor layer 140 in the procedure of forming the second type organic semiconductor layer 160 can be prevented. Preferably, as the CMOS element 1 comprises the first etching stopper layer 191 and the second etching stopper layer 192 at the same time, the first etching stopper layer 191 and the second etching stopper layer 192 are at the same layer for convenience of forming the first etching stopper layer 191 and the second etching stopper layer 192.

Figure 5:
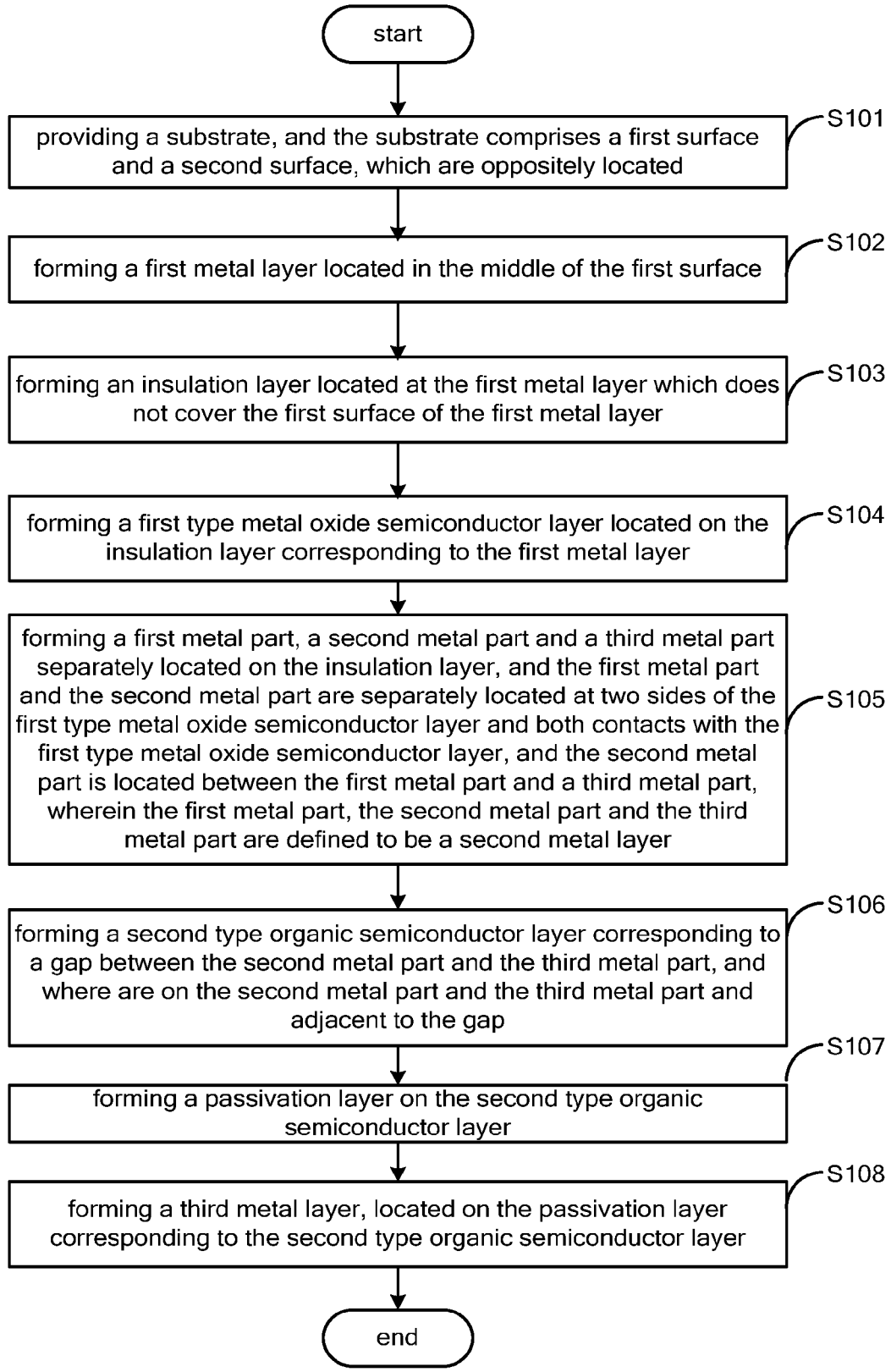
FIG. 5 is a flowchart of a manufacture method of a complementary metal oxide semiconductor element according to a preferred embodiment of the present invention.

The manufacture method of the complementary metal oxide semiconductor element according to the preferred embodiment of the present invention is introduced below with the aforesaid description and the figures. Please refer to FIG. 5. FIG. 5 is a flowchart of a manufacture method of a complementary metal oxide semiconductor element according to a preferred embodiment of the present invention. The manufacture method of the complementary metal oxide semiconductor element comprises following steps but not limited thereto.

Step S101, providing a substrate 110, and the substrate 110 comprises a first surface 110a and a second surface 110b, which are oppositely located. The substrate 110 can be but not be restricted to be a plastic substrate or a glass substrate.

Step S102, forming a first metal layer 120 located in the middle of the first surface 110a. Specifically, the step S102 comprises steps of:

Step S102a, forming a first conductive layer, of which material of an entire layer is metal on the first surface. The first conductive layer can be formed by sputtering. The material of the first conductive layer can comprise material of Mo/Al or Cu/Ti.

Step S102b, patterning the first conductive layer of the entire layer to form a first metal layer 120 located in the middle of the first surface 110a. The step S102b specifically comprises steps below.

Step I, covering the first conductive layer with a first photoresist layer.

Step II, exposing the first photoresist layer to remove the first photoresist layer at two sides of the first conductive layer.

Step III, etching the first conductive layer which is not covered with the first photoresist layer to remove the first conductive layer which is not covered with the first photoresist layer.

Step IV, stripping the first photoresist layer which is remained to form the first metal layer 120.

Step S103, forming an insulation layer 130 located at the first metal layer 120 and the first surface 110 which does not cover the first metal layer 120. The insulation layer 130 can be formed with Chemical Vapor Deposition (CVD) or coating.

Step S104, forming a first type metal oxide semiconductor layer 140 located on the insulation layer 130 corresponding to the first metal layer 120. Specifically, the step S104 comprises steps below.

Step S104a, forming a first semiconductor layer which is an entire layer on the insulation layer 130.

Step S104b, covering the entire first semiconductor layer with a second photoresist layer.

Step S104c, exposing the second photoresist layer to remove the second photoresist layer at two sides of the first semiconductor layer to preserve the second photoresist layer corresponding to the first metal layer.

Step S104d, etching the first semiconductor layer which is not covered with the second photoresist layer to remove the first semiconductor layer which is not covered with the second photoresist layer.

Step S104e, stripping the second photoresist layer which is remained to form the first type metal oxide semiconductor layer 140.

Step S105, forming a first metal part 151, a second metal part 152 and a third metal part 153 separately located on the insulation layer 130, and the first metal part 151 and the second metal part 152 are separately located at two sides of the first type metal oxide semiconductor layer 140 and both contacts with the first type metal oxide semiconductor layer 140, and the second metal part 152 is located between the first metal part 151 and a third metal part 153, wherein the first metal part 151, the second metal part 152 and the third metal part 153 are defined to be a second metal layer 150. Specifically, the step S105 comprises steps below.

Step S105a, forming a second conductive layer, of which material of an entire layer is metal on the insulation layer 130.

Step S105b, covering the second conductive layer with a third photoresist layer.

Step S105c, exposing the third photoresist layer to form a first via corresponding to a middle of the first type metal oxide semiconductor layer 140 and a second via separately located with the first via to partially expose the second conductive layer.

Step S105d, etching the second conductive layer which is not covered with the third photoresist layer to remove the second conductive layer which is not covered with the third photoresist layer.

Step S105e, stripping the third photoresist layer to form the first metal part 151, the second metal part 152 and the third metal part 153.

Step S106, forming a second type organic semiconductor layer 160 corresponding to a gap 154 between the second metal part 152 and the third metal part 153, and where are on the second metal part 152 and the third metal part 153 and adjacent to the gap 154. Specifically, the step S106 comprises steps below.

Step S106a, covering a second organic semiconductor layer with an entire layer. The material of the second organic semiconductor layer can be pentacene.

Step S106b, patterning the second organic semiconductor layer to preserve the second organic semiconductor layer corresponding to the gap 154 between the second metal part 152 and the third metal part 153, and the second metal part 152 adjacent to the gap 154 and the third metal part 153 adjacent to the gap 154 to form the second type organic semiconductor layer 160.

Step S107, forming a passivation layer 170 on the second type organic semiconductor layer 160. The passivation layer 170 can be formed by CVD or coating.

Step S108, forming a third metal layer 180, located on the passivation layer 170 corresponding to the second type organic semiconductor layer 160. Specifically, the step S108 comprises steps below.

Step S108a, forming a third conductive layer, of which material of an entire layer is metal on the passivation layer 170. The third conductive layer can be formed by sputtering. The material of the third conductive layer can comprise material of Mo/Al or Cu/Ti. Materials of the first metal layer 120, the second metal layer 150 and the third metal layer 180 can be the same or different.

Step S108b, covering the third conductive layer with a fourth photoresist layer.

Step S108c, exposing the fourth photoresist layer to preserve the fourth photoresist layer corresponding to the second type organic semiconductor layer 160 and to remove the rest fourth photoresist layer.

Step S108d, etching the third conductive layer which is not covered with the fourth photoresist layer to remove the third conductive layer which is not covered with the fourth photoresist layer.

Step S108e, stripping the rest fourth photoresist layer to form the third metal layer 180.

In one embodiment, the manufacture method of the CMOS element further comprises steps below.

Step S109, forming a first etching stopper layer 191, and a first via 191a is formed in the first etching stopper layer 191, and the first etching stopper layer 191 is located between the first metal part 151 and the first type metal oxide semiconductor layer 140, and the first metal part 151 is connected with the first type metal oxide semiconductor layer 140 through the first via 191a.

Step S110, forming a second etching stopper layer 192, and a second via 192a is formed in the second etching stopper layer 192, and the second etching stopper layer 192 is located between the second metal part 152 and the first type metal oxide semiconductor layer 140, and the second metal part 152 is connected with the first type metal oxide semiconductor layer 140 through the second via 192a.

In this embodiment, the first type metal oxide semiconductor layer 140 is a N-type metal oxide semiconductor layer, and the second type organic semiconductor layer 160 is a P-type organic semiconductor layer. It should be understood that in another embodiment, the first type metal oxide semiconductor layer 140 is a P-type metal oxide semiconductor layer, and the second type organic semiconductor layer 160 is a N-type organic semiconductor layer. As the first type metal oxide semiconductor layer 140 is the N-type metal oxide semiconductor layer, the first type metal oxide semiconductor layer 140 is IGZO or ITZO.

In comparison with prior art, the NMOS and the PMOS in the CMOS element 1 of the present invention and the manufacture method of the CMOS element 1 are manufactured with the first type metal oxide semiconductor layer 140 and the second type organic semiconductor layer 160. Therefore, the processes of the laser annealing, doping, and ion implantation required in prior art utilizing the LTPS process, and the high cost manufacture equipments required for these processes can be omitted. Accordingly, the manufacture process of the CMOS can be simplified to reduce the production cost of the CMOS element. Besides, the drain of the NMOS and the source of the PMOS are connected, the solo step of connecting the drain of the NMOS and the source of the PMOS is no longer required, and the manufacture process of the CMOS element can be simplified.

Above are embodiments of the present invention, which does not limit the scope of the present invention. Any modifications, equivalent replacements or improvements within the spirit and principles of the embodiment described above should be covered by the protected scope of the invention.

What is claimed is:

1. A complementary metal oxide semiconductor element, wherein the complementary metal oxide semiconductor element comprises:
    a substrate, and the substrate comprises a first surface and a second surface, which are oppositely located;
    a first metal layer located in the middle of the first surface;
    an insulation layer located at the first metal layer and the first surface which does not cover the first metal layer;
    a first type metal oxide semiconductor layer located on the insulation layer corresponding to the first metal layer;
    a first metal part, a second metal part and a third metal part separately located on the insulation layer, respectively, and the first metal part and the second metal part are separately located at two sides of the first type metal oxide semiconductor layer and both contacts with the first type metal oxide semiconductor layer, and the second metal part is located between the first metal part and the third metal part, wherein the first metal part, the second metal part and the third metal part are defined to be a second metal layer;
    a second type organic semiconductor layer, and the second type organic semiconductor layer is located in a gap between the second metal part and the third metal part, and on the second metal part and the third metal part where are adjacent to the gap;
    a passivation layer, located on the first metal part, the second metal part and the third metal part, the first type metal oxide semiconductor layer between the first metal part and the second metal part, and the second type organic semiconductor layer;
    a third metal layer, located on the passivation layer corresponding to the second type organic semiconductor layer.

2. The complementary metal oxide semiconductor element according to claim 1, wherein the complementary metal oxide semiconductor element further comprises:
    a first etching stopper layer, and the first etching stopper layer comprises a first via, and the first etching stopper layer is located between the first metal part and the first type metal oxide semiconductor layer, and the first metal part is connected with the first type metal oxide semiconductor layer through the first via.

3. The complementary metal oxide semiconductor element according to claim 2, wherein the complementary metal oxide semiconductor element further comprises:
    a second etching stopper layer, and the second etching stopper layer comprises a second via, and the second etching stopper layer is located between the second metal part and the first type metal oxide semiconductor layer, and the second metal part is connected with the first type metal oxide semiconductor layer through the second via.

4. The complementary metal oxide semiconductor element according to claim 1, wherein the first type metal oxide semiconductor layer is a N-type metal oxide semiconductor layer, and the second type organic semiconductor layer is a P-type organic semiconductor layer; or the first type metal oxide semiconductor layer is a P-type metal oxide semiconductor layer, and the second type organic semiconductor layer is a N-type organic semiconductor layer.

5. The complementary metal oxide semiconductor element according to claim 4, wherein as the first type metal oxide semiconductor layer is the N-type metal oxide semiconductor layer, the first type metal oxide semiconductor layer is IGZO or ITZO.

* * * * *